United States Patent [19]

Wakiyama et al.

[11] Patent Number: 4,989,005
[45] Date of Patent: Jan. 29, 1991

[54] METHOD OF ANALOG/DIGITAL CONVERSION

[75] Inventors: Yoshihiro Wakiyama; Yoshiro Ohnishi, both of Kyoto, Japan

[73] Assignee: Horiba, Ltd., Kyoto, Japan

[21] Appl. No.: 244,552

[22] Filed: Sep. 12, 1988

Related U.S. Application Data

[63] Continuation-in-part of Ser. No. 948,139, Dec. 29, 1986, abandoned.

[30] Foreign Application Priority Data

Dec. 28, 1985 [JP] Japan .......................... 60-203324[U]

[51] Int. Cl.$^5$ .............................................. H03M 1/50
[52] U.S. Cl. ..................................... 341/166; 341/118
[58] Field of Search ........................ 341/118, 124, 166

[56] References Cited

U.S. PATENT DOCUMENTS

| | | | |
|---|---|---|---|
| 2,824,285 | 2/1958 | Hunt | 341/166 X |
| 3,982,241 | 9/1976 | Lipcon | 341/118 |
| 4,183,016 | 1/1980 | Sawagata | 341/122 |
| 4,288,873 | 9/1981 | Gingell | 341/118 X |

FOREIGN PATENT DOCUMENTS

0034671 3/1979 Japan .......................... 340/347 A D

Primary Examiner—William M. Shoop, Jr.
Assistant Examiner—Marc S. Hoff
Attorney, Agent, or Firm—Wenderoth, Lind & Ponack

[57] ABSTRACT

An analog/digital converter includes a peak holding circuit for holding a peak voltage of input analog data and a peak time detecting circuit for detecting a point of time when the input analog data reaches a peak voltage. Also included is a constant current discharging circuit for discharging the peak voltage held in the peak holding circuit at a constant current from the peak point of time detected by the peak time detecting circuit. The converter also includes a zero time detecting circuit for detecting a zero point of time when a voltage held in the peak holding circuit is reduced to zero and a time to digital converting circuit for counting a number of pulses in a pulse line obtained by gating clock pulses during a period of time from the peak time detected by the peak detecting circuit to the zero time detected by the zero time detecting circuit, the time to digital converting including a counter to output digital data corresponding to the input analog data. A positive offset analog voltage is added to the input analog data and a digital compensator compensates the digital data obtained by the time to digital converting circuit by providing a negative offset digital value approximately corresponding to the positive offset analog voltage, more correctly, equal to a number of pulses in a pulse line passing through a clock gate of the time-to-digital converting circuit for a period of time during which the input analog data has a value equal to zero.

12 Claims, 7 Drawing Sheets

METHOD OF ANALOG/DIGITAL CONVERSION

This application is a continuation-in-part of U.S. patent application Ser. No. 06/948,139, filed Dec. 29, 1986, now abandoned.

BACKGROUND OF THE INVENTION

1. Field of the Invention

The present invention relates to a method of analog/digital conversion in an analog/digital converter used in a pulse height analyzer for measuring a spectrum of pulse heights and the like in the field of radiation instrument technology in the nuclear industry, medical sciences and the like. More particularly, the present invention relates to a method of conversion in a so-called Wilkinson type (counting type) analog/digital converter for holding analog data inputted by a pulse-height-to-time converting means and then discharged at a constant current so as to obtain a time signal which is proportional to a magnitude of the analog data and for counting a number of pulses in a pulse line, obtained by gating clock pulses by the time signal, using a counter so as to obtain digital data outputs corresponding to the input analog data. Even more particularly, the present invention relates to a method of conversion in an analog/digital converter comprising a peak-holding circuit for holding a peak voltage of the inputted analog data, a peak-time detecting circuit for detecting a peak time when the input analog data reaches a peak voltage, a constant-current discharge circuit for discharging, at a constant current, the peak voltage held in the peak-holding circuit from a point of time when the peak time is detected by means of the peak-time detecting circuit, a zero-time detecting circuit for detecting a zero time when a voltage held in the peak-holding circuit is reduced to zero, and a time-to-digital converting circuit for counting a number of pulses in a pulse line, obtained by gating clock pulses from the point of time when the peak time is detected by the peak-time detecting circuit until the point of time when the zero time is detected by the zero-time detecting circuit, using a counter to output digital data corresponding to the input analog data.

2. Description of the Prior Art

In general, a Wilkinson type (counting type) analog/digital converter (hereinafter called an ADC for short) having superior characteristics in differential linearity has been mainly used as an ADC for use in a pulse height analyzer used in the above described fields since, of the various required characteristics, a superior uniformity of width occupied by each channel (a digitalized value is called a channel) is particularly required.

Figure 7:
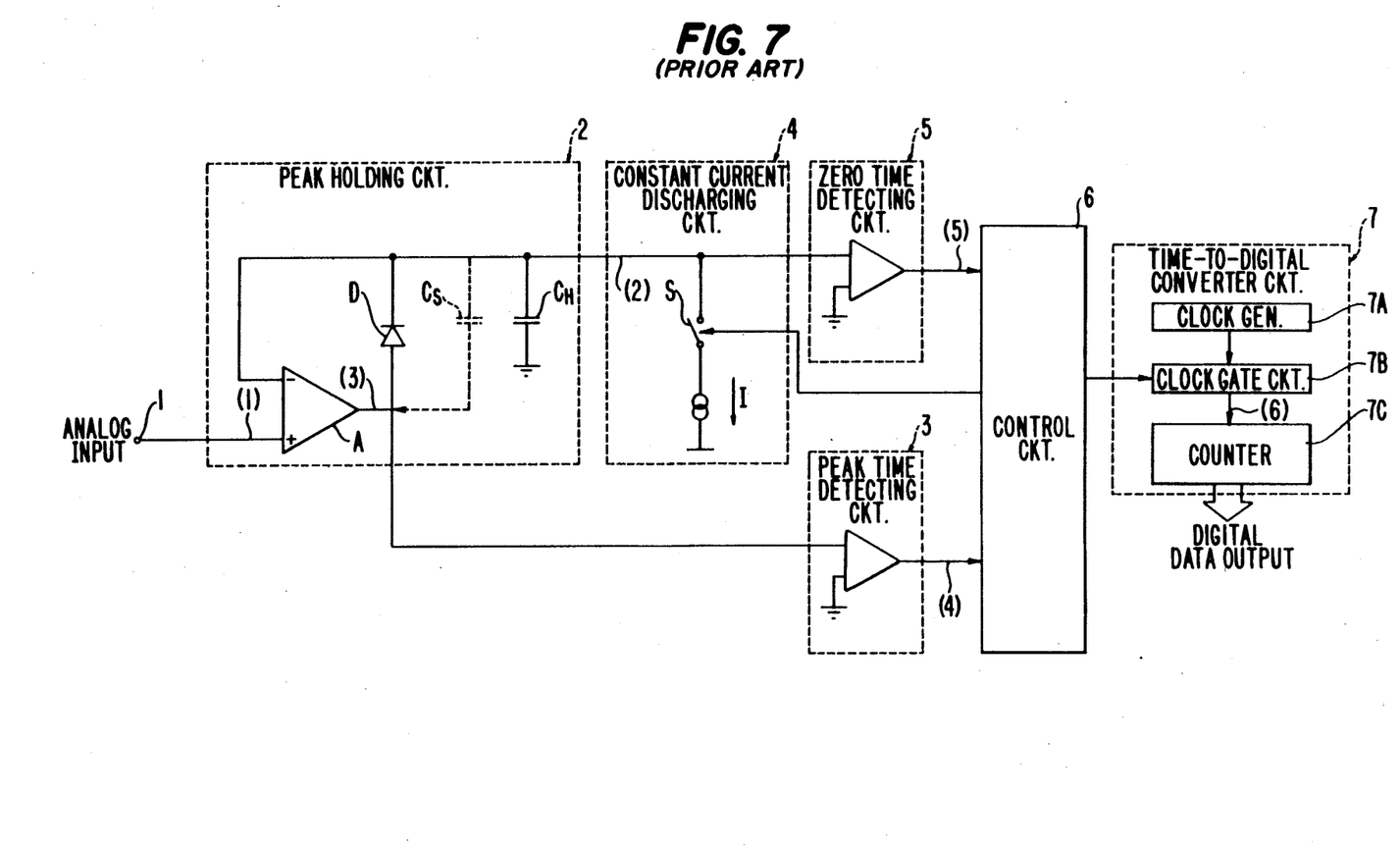
FIG. 7 is a block diagram of a conventional ADC as discussed above.
Figure 8:
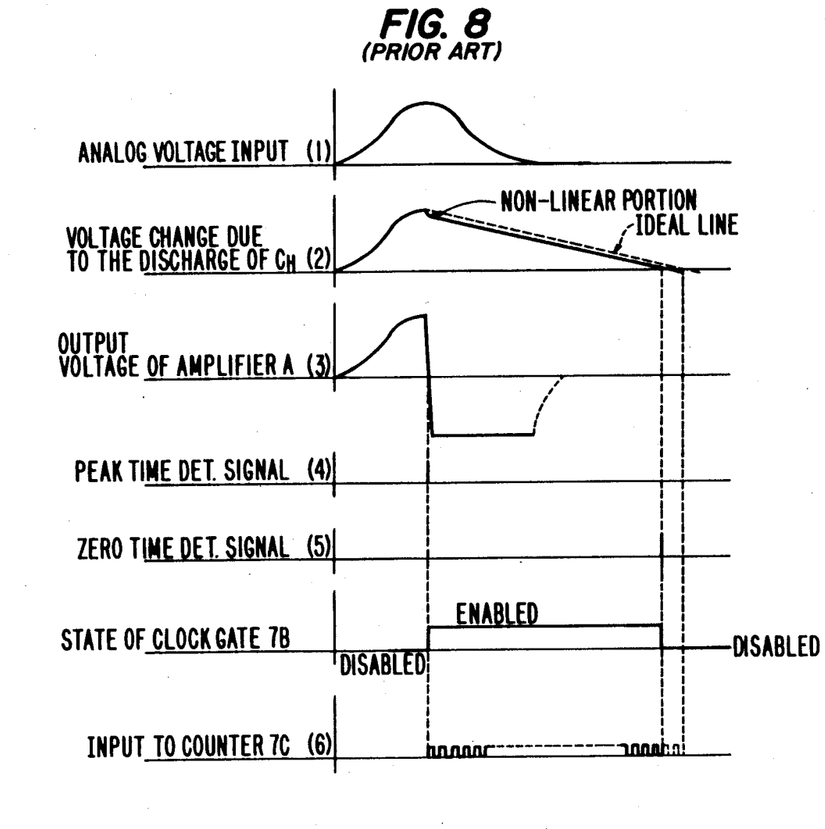
FIG. 8 illustrates timing charts for explaining the operation of the conventional ADC of FIG. 7.

The conventional counting type ADC has a construction as shown in FIG. 7, which is a block diagram, and FIG. 8 which consists of timing charts of signals for each part of FIG. 7.

That is to say, referring not to FIG. 7, reference numeral 1 designates an input terminal in which analog data (1) is input. Numeral 2 designates a peak-holding circuit including a differential amplifier A, a diode D, a charging/discharging capacitor $C_H$ and the like therein. Numeral 3 designates a peak-time detecting circuit for detecting a point of time, when the input analog data (1) reaches a peak voltage, on the basis of an output voltage (3) of the differential amplifier A and for outputting a peak-time detecting signal (4) corresponding thereto. Numeral 4 designates a constant-current discharging circuit for closing a switch S by an order from a control circuit 6 at the point of time that the peak time is detected by the peak-time detecting circuit 3 so as to discharge the peak voltage held in the charging/discharging capacitor $C_H$ in the peak-holding circuit 2. Numeral 5 designates a zero-time detecting circuit for detecting a point of time when a voltage (2) held in the charging/discharging capacitor $C_H$ in the peak-holding circuit 2 is reduced to zero, (zero time) and for outputting a zero-time detecting signal (5) corresponding thereto. Numeral 7 designates a time-to-digital converting circuit comprising a clock generator 7A for generating clock pulses, a clock gate circuit which is 7B maintained in an enabled condition by means of the control circuit 6 so that the clock pulses may be passed therethrough from the clock generator 7A only for a period of time from the point of time when the peak is detected to the point of time when the zero time is detected, and a counter 7C for counting a number of pulses in a pulse line (6) output from the clock gate circuit 7B so as to output digital data corresponding to the input analog data (1).

That is to say, as obvious from timing charts of signals for each part as shown in FIG. 8, this counting type ADC detects the peak time of the input analog data (1) by means of the peak-time detecting circuit 3 on the basis of a change in the output voltage (3) from the differential amplifier A in the peak-holding circuit 2 to obtain the peak-time detecting signal (4) as the time signal, and detects the point of time when the voltage (2) charged in the charging/discharging capacitor CHR is reduced to zero so as to obtain the zero-time detecting signal (5) by discharging the peak voltage held in the charging/discharging capacitor $C_H$ in the peak-holding circuit 2 by means of the constant current discharging circuit 4 for a period of time proportional to the peak value of the input analog data (1) at a constant current I, and feeds the pulse line (6) having a number of pulses proportional to a magnitude (peak value) of the input analog data (1) into the counter 7 so as to obtain digital data corresponding to the input analog data (1) by controlling the clock gate 7B on the basis of the peak-time detecting signal (4) and the zero-time detecting signal (5).

However, a counting type ADC having the above described construction has shown the following problems.

That is to say, as obvious from the timing charts as shown in FIG. 8, it is found from the detailed investigation of a change in the voltage (2) due to the constant current discharge of the charging/discharging capacitor CH in the peak-holding circuit 2 that although ideally speaking, a waveform as shown by the dotted line should be obtained, in fact the output (3) of the differential amplifier A in the peak-holding circuit 2 is influenced by the capacity of the diode D and other stray capacities $C_s$ (shown in the drawing by a dotted line, so that a nonlinear portion, as shown in the drawing, is produced for a very short period of time from the point of time when the discharge is begun (this is deemed as a settling time of the peak-holding circuit 2) and as a result, the zero-time detecting signal (5) rises faster than in the original case and a period of time during which the clock gate circuit 7B is enabled is shortened, whereby the number of pulses in the input pulse line (6) input to the counter 7C is reduced. Thus, the digital data output from the time-to-digital converting circuit 7 is reduced to a value which is lower than the original desired value.

Figure 9:
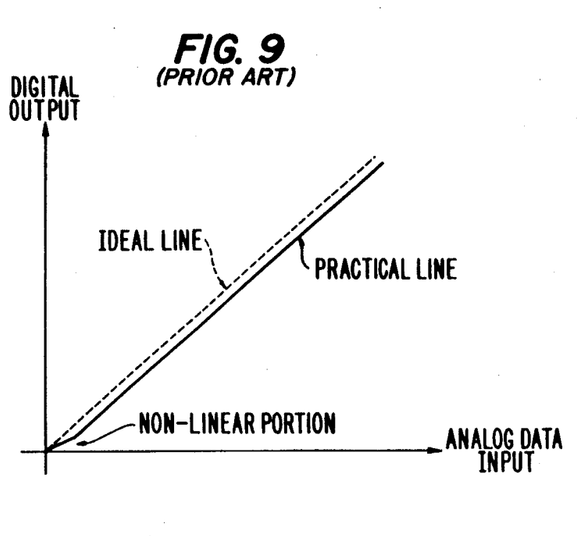
FIG. 9 an input-output characteristic graph of the of FIG. 7.

As shown in FIG. 9, which is an input-output characteristic diagraph, a problem of this nonlinear portion leads to not only a general deterioration of an accuracy of conversion but also the generation of the zero-time detecting signal (5) in the vicinity of the nonlinear portion, particularly in the case where the input analog signal is small, so that a very large error appears.

SUMMARY OF THE INVENTION

The present invention was achieved in view of the above described actual state an it is and object of the present invention to provide a method of conversion for an analog/digital converter provided with means for sufficiently compensating for the deterioration in the accuracy of conversion due to nonlinear portion which is directly generated after the start of the constant-current discharge as mentioned above in spite of a relatively simple construction.

In order to achieve the above described object, an analog/digital converter according to the method of the present invention having a basic construction as described above includes a means for generating a positive offset analog voltage to be added to input analog data and a digital compensating means for compensating digital data obtained by a time-to-digital converting circuit with a negative offset digital value approximately corresponding to the positive offset analog voltage and, more correctly, equal to the number of pulses in a pulse line passing through a clock gate of the time-to-digital converting circuit for a period of time during which the input analog data is zero.

In addition, as obvious from the description of preferred embodiments which will be described later, various constructions can be used for the means for generating an offset analog voltage, for example, an input stage of a peak-holding circuit may be provided with an offset analog voltage-adding circuit for directly adding a positive offset analog voltage to input analog data fed into the peak-holding circuit or a comparative level-shifting circuit for generating a negative comparative level voltage approximately corresponding to a positive offset analog voltage fed to a zero-time detecting circuit. Besides, various constructions can be used for the digital compensating means, for example, a time-to-digital converting circuit may be provided with an initial digital value-setting circuit for preliminary loading a pulse counter of the time-to-digital converter with a negative offset digital value approximately corresponding to a positive offset analog voltage either internally or externally, a digital adder for adding a negative offset digital value corresponding to a positive offset analog voltage added to digital data output from the time-to-digital converting circuit, or a digital subtracter for subtracting a positive offset digital value.

The effects due to the above described characteristic construction are as follows:

That is to say, according to an analog/digital converter of a method of conversion of the present invention, as further obviously understood from the description of preferred embodiments which will be described later, a nonlinear portion or a zero-time detecting signal in the vicinity of the nonlinear portion generated directly after the beginning of a constant current discharge from a charging/discharging capacitor in the peak-holding circuit are prevented by adding a positive offset analog voltage to input analog data. In addition, digital data obtained by a time-to-digital converting circuit is increased with respect to the original values by adding the offset analog voltage but digital data obtained by the time-to-digital converting circuit are compensated by a negative offset digital value equal to a number of pulses in a pulse line passing through a clock gate of the time-to-digital converting circuit for a period of time during which the input analog data is zero (in other words, approximately corresponding to the positive offset analog voltage), so that an increase in the counted value corresponds to the positive offset analog voltage and, so that the deterioration of an accuracy of conversion due to the above described nonlinear portion generated directly after the beginning of the discharge can be synthetically sufficiently compensated in spite of a relatively simple construction, thereby significantly improving the general accuracy of conversion regardless of the magnitude of the input analog data, as shown by the input-output characteristic diagram in FIG. 3 which will be described in detail later.

BRIEF DESCRIPTION OF THE DRAWINGS

Various preferred embodiments of an analog/digital converter according to the present invention will be below described with reference to the drawings in which.

DESCRIPTION OF THE PREFERRED EMBODIMENTS

Figure 1:
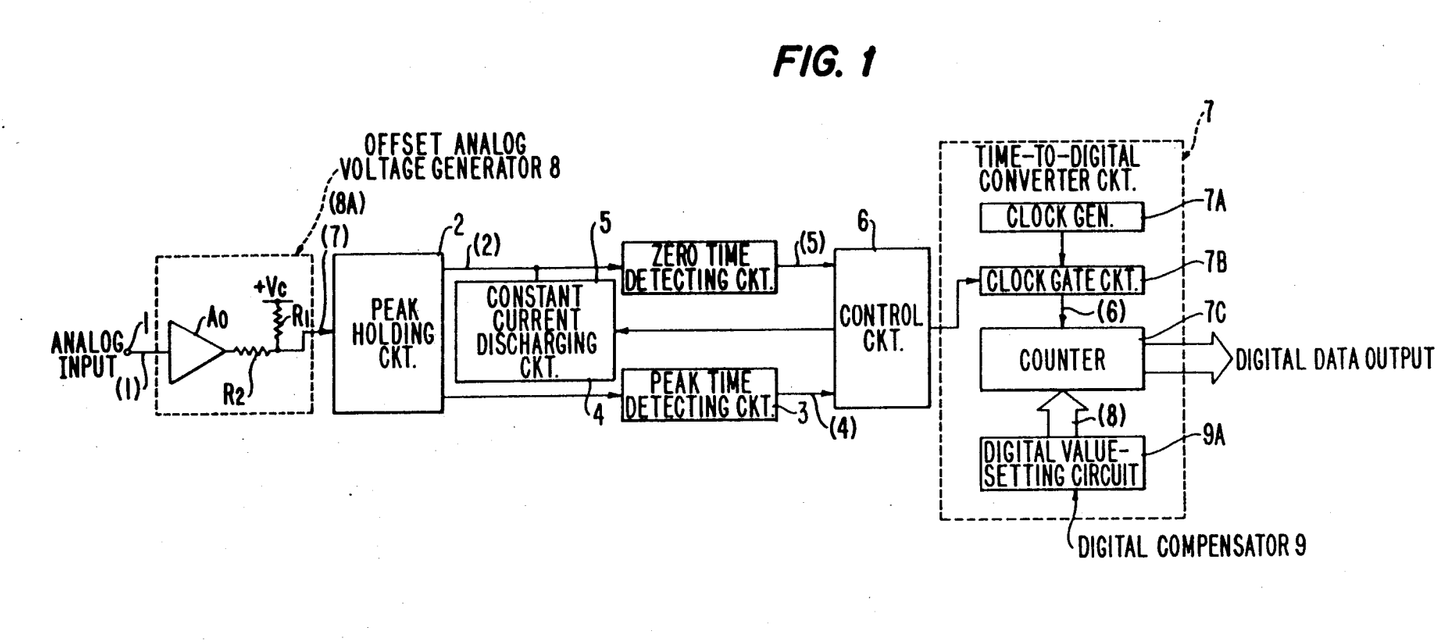
FIG. 1 is a block diagram showing the construction of a first preferred embodiment.

Referring not to FIG. 1, an input terminal is designated by reference numeral 1. A peak-holding circuit is designated by reference numeral 2. A peak-time detecting circuit is designated by reference numeral 3. A constant-current discharging circuit is designated by reference numeral 4. A zero-time detecting circuit is designated by reference numeral 5. A control circuit is designated by reference numeral 6. A clock is designated by 7A, and a clock gate circuit designated by 7B and a counter designated by 7C in a time-to-digital converting circuit 7. The abovenoted constituent elements are the same as that of the conventional analog/digital converter described with reference to FIG. 7, and accordingly, their description has been omitted here for the sake of brevity. An offset analog voltage generator 8 and a digital compensator 9, which are constituent elements unique to the present invention, are described below.

That is to say, the offset analog voltage generator 8 adds a positive offset analog voltage $V_o$ to the input analog data (1). In this preferred embodiment, the positive offset analog voltage $V_o$ is directly added to the analog data (1) input from the input terminal 1 by providing an input stage of the peak-holding circuit 2 with an offset analog voltage-adding circuit 8A consisting of an amplifier $A_o$, fixed resistances $R_1$ and $R_2$, and a constant-voltage supply source $+V_c$.

In addition, the digital compensator 9 compensates the digital data obtained by the counter 7C of the time-to-digital converting circuit 7 with a negative offset digital value approximately corresponding to the positive offset analog voltage $V_o$ added to the input analog data (1). In this preferred embodiment, the counter 7C is provided with an initial digital value-setting circuit 9A for preliminary loading a negative offset digital value (8) for cancelling an increase of a counted value corresponding to the positive offset analog voltage $V_o$ and for compensating the deterioration of an accuracy of conversion due to the nonlinear portion generated directly after the beginning of the discharge at the same time. Concretely speaking, this negative offset digital value (8) is a negative value equal to a number of pulses in a pulse line passing through the clock gate 7B of the time-to-digital converting circuit 7 for a period of time during which the input analog data (1) is zero. Therefore, the negative value becomes, in fact, slightly smaller than a negative value corresponding to the positive offset analog voltage $v_o$. In addition, the digital compensator 9 consisting of this initial digital value-setting circuit 9A may be provided inside the time-to-digital converting circuit 7, as shown in the drawing, or may be provided outside the time-to-digital converting circuit 7.

Figure 2:
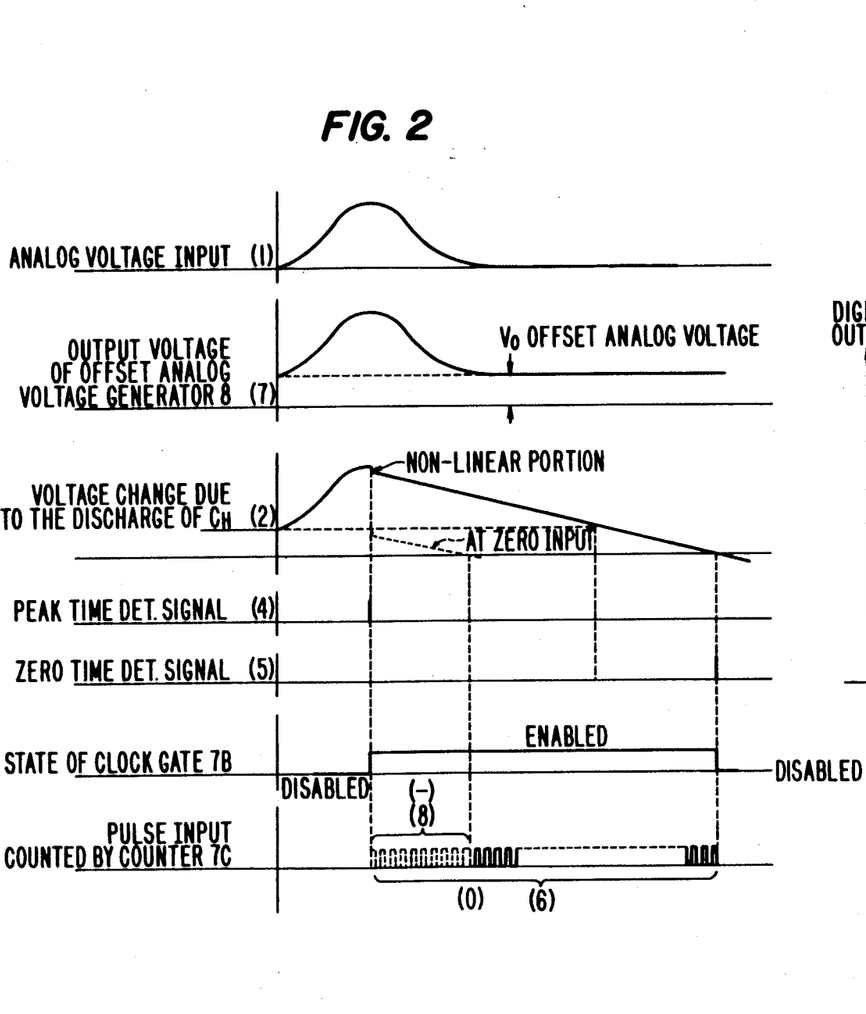
FIG. 2 illustrates timing charts of signals at each part for explaining the operation of the first preferred embodiment.

Nextly, the operation of an analog/digital converter constructed in the above described manner is described with reference to the timing charts of signals at each part as shown in FIG. 2.

That is to say, upon inputting the analog data (1) to the input terminal 1, a voltage (7) obtained by adding positive offset analog volta $V_o$ to the analog data (1) is output from the offset analog voltage generator 8 comprising the offset analog voltage-adding circuit 8A to be supplied to the peak-holding circuit 2. A point in time when the analog data (1) arrives at a peak voltage is detected by the peak-time detecting circuit 3 in the same manner as in the conventional analog/digital converter of FIG. 7 and the peak voltage held in the charging/discharging capacitor $C_H$ in the peak-holding circuit 2 is discharged by the constant-current discharging circuit 4 at a constant current I from the point of the peak time, so that a voltage of the charging/discharging capacitor $C_H$ is changed as shown in the drawing. Accordingly, a time when the zero-time detecting circuit 5 detects a point of time, when the voltage of the charging/discharging capacitor $C_H$ is reduced to zero so as to emit the zero-time detecting signal (5) (as shown by the full line), is delayed from the original timing (as shown by dotted line) by a value corresponding to the additional positive offset analog voltage $V_o$ and as a result, the clock gate 7B of the time-to-digital converting circuit 7 is enabled for a period of time longer than that in the conventional circuit, whereby a pulse line containing pulses of a number larger than that in the conventional circuit is input. But, the counter 7C is preliminarily loaded with the negative offset digital value (8) for cancelling the increase in the counted value corresponding to the positive offset analog voltage $V_o$ and for compensating for the deterioration of an accuracy of conversion due to the nonlinear portion generated directly after the beginning of the discharge at the same time by means of the digital compensator 9 comprising the initial digital value-setting circuit 9A, so that the value counted by the counter 7C becomes zero from a minus counted-value condition (as shown by a dotted line) at a point in time when the voltage corresponding to the positive offset analog voltage $V_o$ is reduced from the charging/discharging capacitor $C_H$ and then a plus counted-value condition (as shown by a full line) is started. Consequently, the final counted value of the counter 7C becomes (6)–(8) which is dependent merely upon the input analog data (1) regardless of the positive offset analog voltage $V_o$. In addition, influences caused by a nonlinear portion directly after the start of the constant-voltage discharge can be completely eliminated by providing the positive offset analog voltage $V_o$.

Figure 3:
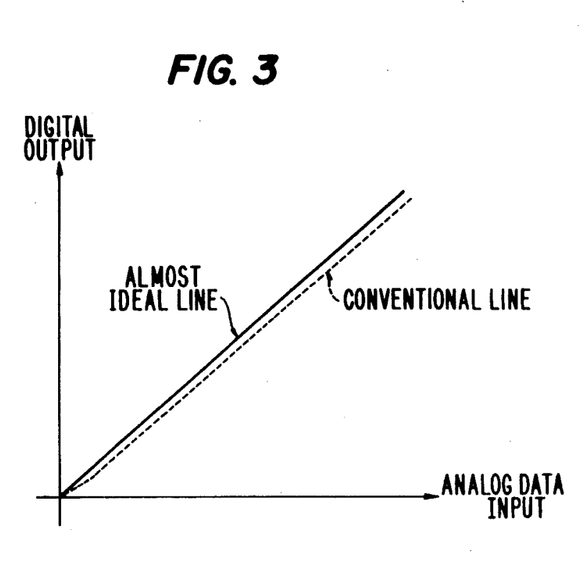
FIG. 3 is an input-output characteristic graph in which an effect of the preferred embodiment of the present invention is compared with that of the conventional analog/digital converter.

As a result of the above described operation, as shown in FIG. 3, the input/output characteristics of an analog/digital converter according to the present invention are improved significantly in comparison with those of the conventional analog/digital converter so as to be nearly ideal.

Figure 4:
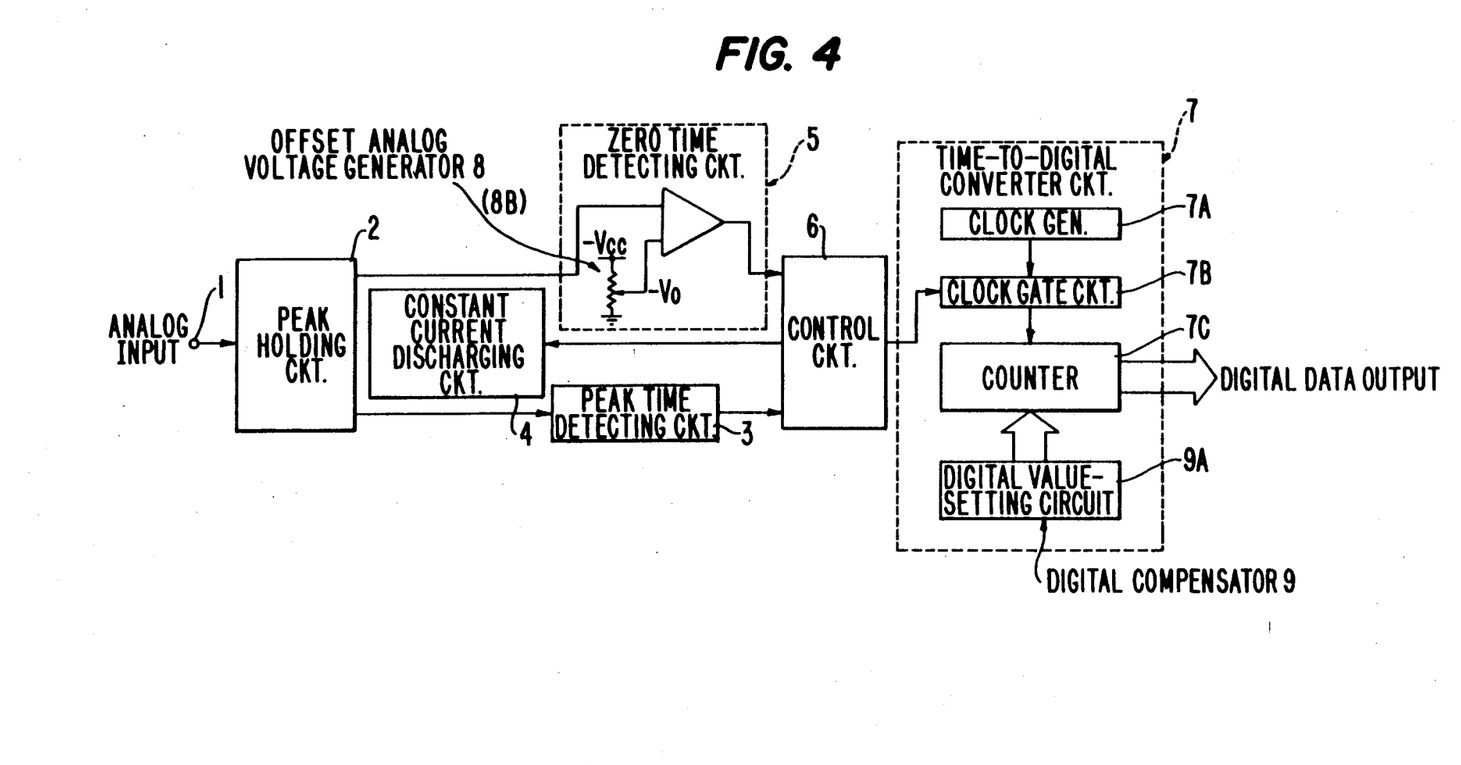
FIG. 4 is a block diagram of a second preferred embodiment.

In the second preferred embodiment of the present invention, as illustrated in FIG. 4, in order to construct the offset analog voltage-generator 8, an input stage of the peak-holding circuit 2 is not provided with the offset analog voltage-adding circuit 8A to directly add the positive offset analog voltage $V_o$ to the analog data (1) input from the input terminal 1 as in the above described first preferred embodiment but the positive offset analog voltage $V_o$ is indirectly added to the input analog data (1) by providing the zero-time detecting circuit 5 with a comparative level-shifting circuit 8B for generating a negative comparative level voltage $-V_o$ corresponding to the positive offset analog voltage $V_o$. It is obvious that such a construction also leads to the same effects as in the above described first preferred embodiment.

Figure 5:
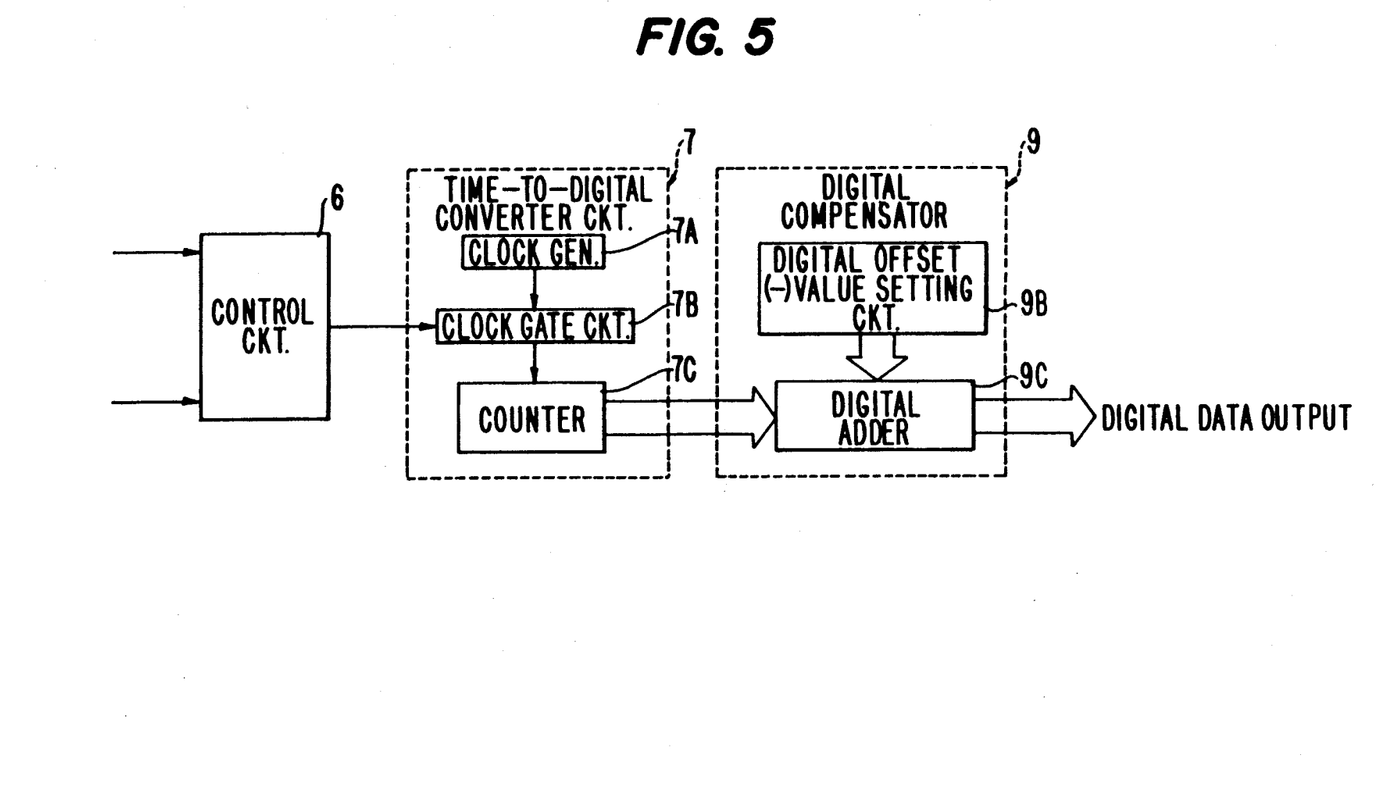
FIG. 5 partial block diagram of the main features of a preferred embodiment.

In this third preferred embodiment of the present invention, as illustrated in FIG. 5, in order to construct the digital compensator 9, the counter 7C of the time-to-digital converting circuit 7 is not preliminarily loaded with the negative offset analog voltage $V_o$ as in the above described first and second preferred embodiments but the output stage of the time-to-digital converting circuit 7 is provided with a digital offset (−) value-setting circuit 9B and a digital adder 9C so as to add the negative offset digital value approximately corresponding to the positive offset analog voltage $V_o$ to the digital data which is larger than the original value output from the counter 7C later.

Figure 6:
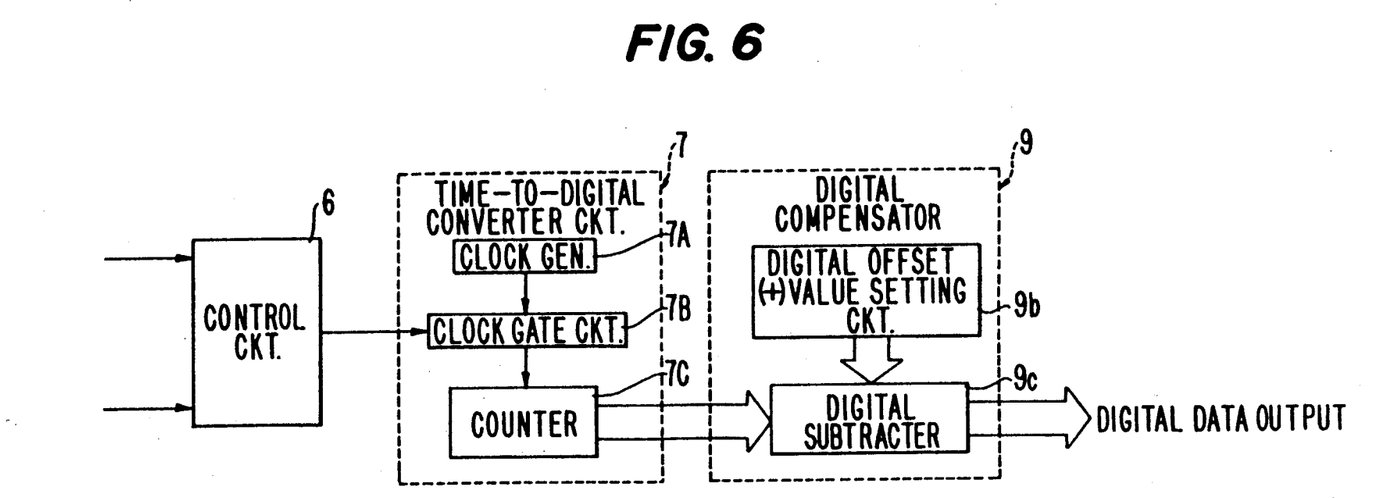
FIG. 6 is a partial block diagram of the main features of a fourth preferred embodiment.

The fourth preferred embodiment of the present invention, as illustrated in FIG. 6, is a modification of the above described third preferred embodiment. In order to construct the digital compensator 9, the output stage of the time-to-digital converting circuit 7 is provided with a digital offset (+) value-setting circuit 9b and a digital subtracter 9c so as to subtract the positive offset digital value approximately corresponding to the positive offset analog voltage $V_o$ later.

It is obvious that the constructions according to these third and fourth preferred embodiments lead to the same effects as in the above described first and second preferred embodiments. In addition, the digital compensator 9 in these third and fourth preferred embodiments may be replaced by a computer.

As is obvious from the detailed description above, with an analog/digital converter according to the present invention, the deterioration of the conversion accuracy can be sufficiently compensated and the general conversion accuracy can be significantly improved regardless of a magnitude of input analog data in spite of a relatively simple construction providing a means for generating a positive offset analog voltage to the input analog data and a digital compensator for compensating digital data obtained by a time-to-digital converting circuit by a negative offset digital value approximately corresponding to said positive offset analog voltage. Furthermore, even though the input analog data is minute, no zero-time detecting signal is generated in the nonlinear portion or in the vicinity of the nonlinear portion, so that a superior effect has been achieved in that a highly accurate digital conversion of minute analog data is possible.

What is claimed is:

1. A method of analog/digital conversion for an analog/digital converter having a peak-holding circuit for holding peak-voltage of input analog data, a peak-time detecting circuit for detecting a point of time when said input analog data reaches a peak voltage, a constant-current discharging circuit for discharging the peak voltage held in said peak-holding circuit at a constant current from the peak point of time detected by said peak-time detecting circuit, a zero-time detecting circuit for detecting a zero point of time when a voltage held in said peak-holding circuit is reduced to zero, and a time-to-digital converting circuit for counting a number of pulses in a pulse line passing through a clock gate during a period of time from the point of time when the peak time is detected by said peak-time detecting circuit to the point of time when the zero time is detected by said zero-time detecting circuit, said pulses being counted by a counter so as to output digital data corresponding to said input analog data; comprising the steps of:

generating and adding a positive offset analog voltage to said input analog data; and compensating digital data obtained by said time-to-digital converting circuit by a negative offset digital value equal to the number of pulses in a pulse line passing through said clock gate of said time-to-digital converting circuit for a period of time during which said input analog data has a value which is equal to zero.

2. A method of analog/digital conversion as set forth in claim 1, wherein the positive offset analog voltage is added directly to said input analog data input to the peak-holding circuit by providing an input stage of said peak-holding circuit with an offset analog voltage-adding circuit.

3. A method of analog/digital conversion as set forth in claim 1, wherein a negative comparative level voltage corresponding to the positive offset analog voltage is added to said zero-time detecting circuit by providing said zero-time detecting circuit with a comparative level-shifting circuit.

4. A method of analog/digital conversion as set forth in claim 1, wherein said negative offset digital value is preliminarily loaded into a counter of said time-to-digital converting circuit by providing said time-to-digital converting circuit with an initial digital value-setting circuit.

5. A method of analog/digital conversion as set forth in claim 2, wherein said negative offset digital value is preliminarily loaded into a counter of said time-to-digital converting circuit by providing said time-to-digital converting circuit with an initial digital value-setting circuit.

6. A method of analog/digital conversion as set forth in claim 3, wherein said negative offset digital value is preliminarily loaded into a counter of said time-to-digital converting circuit by providing said time-to-digital converting circuit with an initial digital value-setting circuit.

7. A method of analog/digital conversion as set forth in claim 1, wherein a negative value corresponding to said negative offset digital value is added to digital data output from said time-to-digital converting circuit by providing said time-to-digital converting circuit with a digital adder.

8. A method of analog/digital conversion as set forth in claim 2, wherein a negative value corresponding to said negative offset digital value is added to digital data output from said time-to-digital converting circuit by providing said time-to-digital converting circuit with a digital adder.

9. A method of analog/digital conversion as set forth in claim 3, wherein said negative value corresponding to said negative offset digital value is added to digital data output from said time-to-digital converting circuit by providing said time-to-digital converting circuit with a digital adder.

10. A method of analog/digital conversion as set forth in claim 1, wherein a positive value corresponding to said negative offset digital value is subtracted from the digital data output from said time-to-digital converting circuit by providing said time-to-digital converting circuit with an digital subtracter.

11. A method of analog/digital conversion as set forth in claim 2, wherein a positive value corresponding to said negative offset digital value is subtracted from the digital data output from said time-to-digital converting circuit by providing said time-to-digital converting circuit with a digital subtracter.

12. A method of analog/digital conversion as set forth in claim 3, wherein a positive value corresponding to said negative offset digital value is subtracted from the digital data output from said time-to-digital converting circuit by providing said time-to-digital converting circuit with a digital subtracter.

* * * * *